(12) United States Patent
Wang et al.

(10) Patent No.: US 8,339,171 B1
(45) Date of Patent: Dec. 25, 2012

(54) THRESHOLD VOLTAGE DETECTION CIRCUIT (75) Inventors: Chua-Chin Wang, Kaohsiung (TW); Ron-Chi Kuo, Kaohsiung (TW); Hsin-Yuan Tseng, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 41 days.

(21) Appl. No.: 13/194,283

(22) Filed: Jul. 29, 2011

(30) Foreign Application Priority Data

Jun. 20, 2011 (TW) .............................. 100121405 A (51) Int. Cl.
*H03K 3/02* (2006.01)
(52) U.S. Cl. ............................ 327/198; 327/142; 326/82
(58) Field of Classification Search .................. 327/108, 327/109, 112, 142, 143, 198; 326/82, 83
See application file for complete search history.

(56) References Cited

U.S. PATENT DOCUMENTS

| | | | | |
|---|---|---|---|---|
| 3,480,796 A | * | 11/1969 | Pfeifer et al. | .................... 326/88 |
| 3,675,043 A | * | 7/1972 | Bell | ................................ 326/70 |
| 4,689,505 A | * | 8/1987 | Ghoshal | ......................... 326/88 |

\* cited by examiner

*Primary Examiner* — Lincoln Donovan
*Assistant Examiner* — William Hernandez
(74) *Attorney, Agent, or Firm* — Jackson IPG PLLC (57) ABSTRACT

A threshold voltage detection circuit comprises a first inverter, a first transistor, a second transistor, a third transistor and a fourth transistor. The first inverter comprises a first terminal and a second terminal, a first electrode of the first transistor is electrically connected with the second terminal of the first inverter, a fourth electrode of the second transistor is electrically connected with the first terminal of the first inverter, a seventh electrode of the third transistor is electrically connected with the second terminal of the first inverter and the first electrode of the first transistor, a tenth electrode of the fourth transistor is electrically connected with a third electrode of the first transistor and a fifth electrode of the second transistor, and an eleventh electrode of the fourth transistor is electrically connected with a ninth electrode of the third transistor.

10 Claims, 8 Drawing Sheets

THRESHOLD VOLTAGE DETECTION CIRCUIT

FIELD OF THE INVENTION

The present invention is generally relating to a detection circuit, more particularly to the detection circuit with accurate detection for MOS transistor threshold voltage.

BACKGROUND OF THE INVENTION

The detection theory of threshold voltage for MOS transistor is to utilize the delay time of delay chains to detect a variety of combinations of process corners such as FF(fast NMOS-fast PMOS), FS(fast NMOS-slow PMOS), TT(typical NMOS-typical PMOS), SS(slow NMOS-slow PMOS) and SF(slow NMOS-fast PMOS). The delay chains are composed of a plurality of inverters, and each of the inverters comprises an NMOS transistor and a PMOS transistor. Once a rise-time measurement based on mentioned structure is proceeding, the measurement results of the rise time of the SS corner and FS corner would be very close. Comparatively, once a fall-time measurement based on mentioned structure is proceeding, the measurement results of the fall time of the SS corner and SF corner would be very close. In this case, the delay chains can not detect all sorts of combinations of process corners precisely.

SUMMARY

The primary object of the present invention is to provide a threshold voltage detection circuit comprising a first inverter, a first transistor, a second transistor, a third transistor and a fourth transistor, wherein the first inverter comprises a first terminal and a second terminal, the first transistor comprises a first electrode, a second electrode and a third electrode, the second transistor comprises a fourth electrode, a fifth electrode and a sixth electrode, the third transistor comprises a seventh electrode, an eighth electrode and a ninth electrode, and the fourth transistor comprises a tenth electrode, an eleventh electrode and a twelfth electrode. The first electrode is electrically connected with the second terminal of the first inverter, the fourth electrode is electrically connected with the first terminal of the first inverter, the seventh electrode is electrically connected with the second terminal of the first inverter and the first electrode of the first transistor, the tenth electrode of the fourth transistor is electrically connected with the third electrode of the first transistor and the fifth electrode of the second transistor, and the eleventh electrode of the fourth transistor is electrically connected with the ninth electrode of the third transistor. In this invention, by utilizing circuit design of the threshold voltage detection circuit, an accurate detection of various threshold voltages for MOS transistors can be effectively performed.

DETAILED DESCRIPTION OF THE INVENTION

Figure 1A:
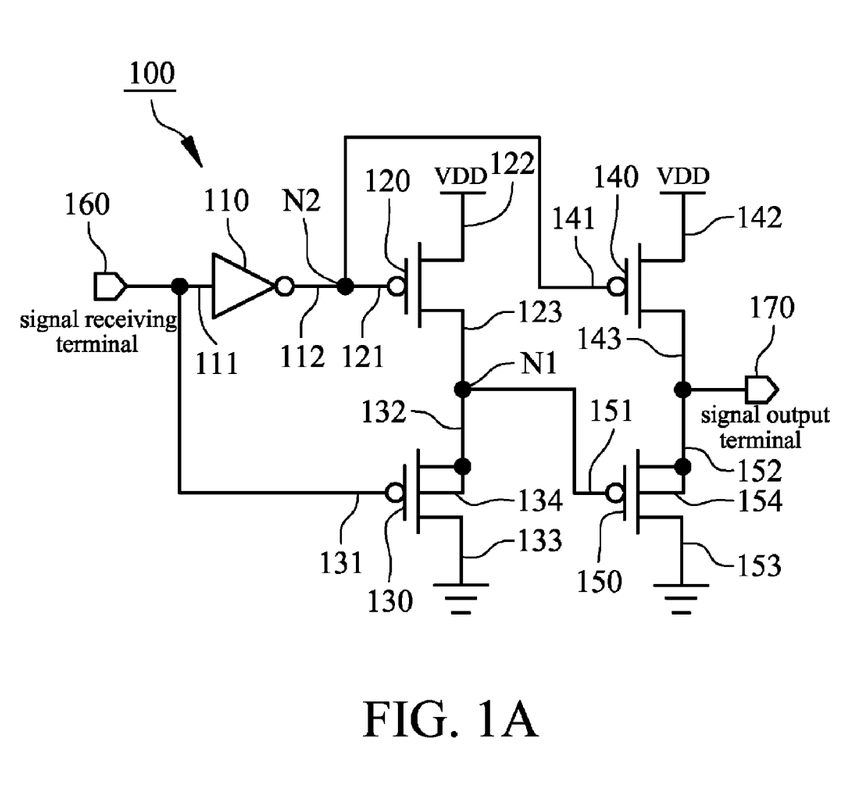
FIG. 1A is a circuit diagram illustrating a threshold voltage detection circuit in accordance with a first preferred embodiment of the present invention.
Figure 2A:
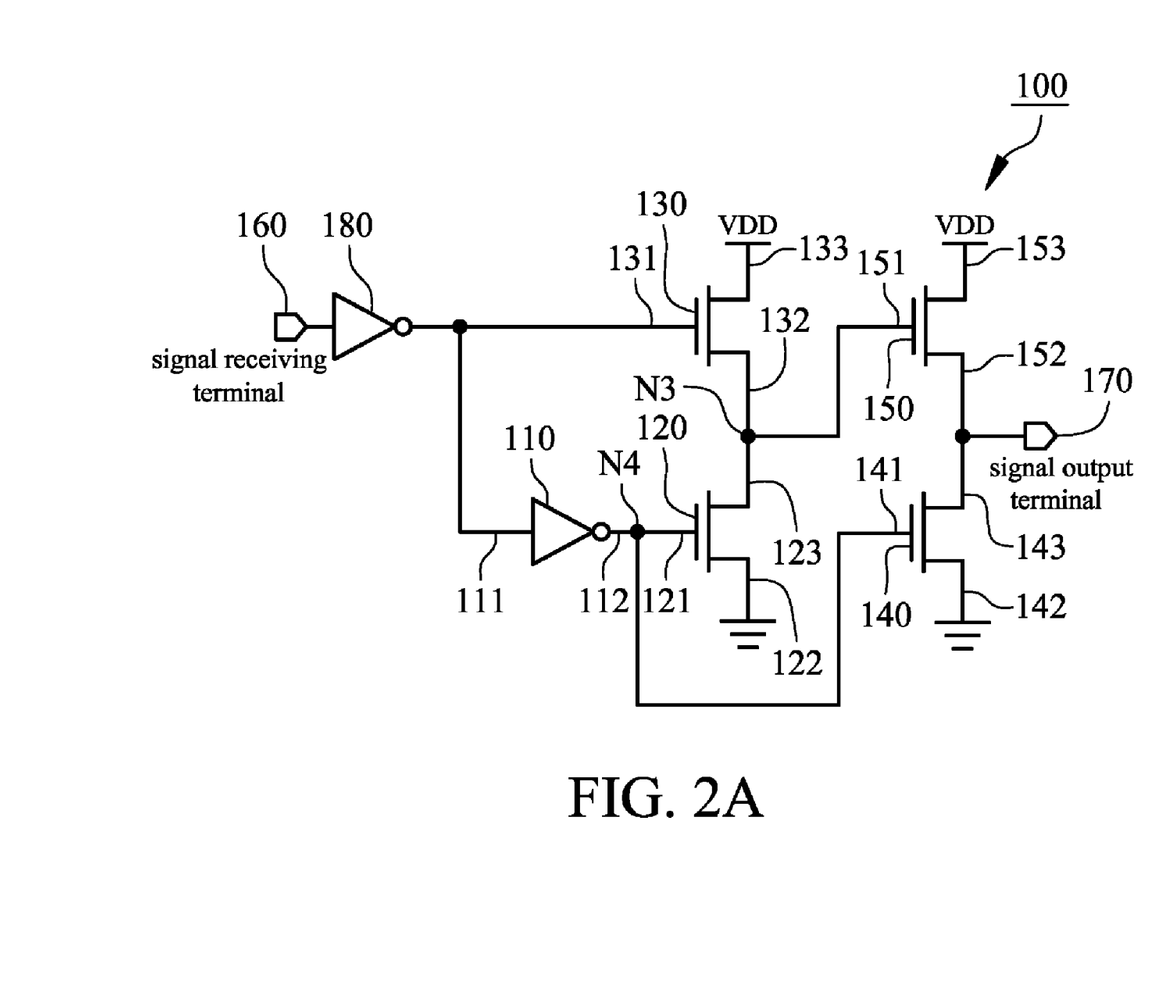
FIG. 2A is a circuit diagram illustrating the threshold voltage detection circuit in accordance with another embodiment of the present invention.

With reference to FIGS. 1A and 2A, a threshold voltage detection circuit 100 in accordance with a preferred embodiment of the present invention comprises a first inverter 110, a first transistor 120, a second transistor 130, a third transistor 140 and a fourth transistor 150, wherein the first inverter 110 comprises a first terminal 111 and a second terminal 112, the first transistor 120 comprises a first electrode 121, a second electrode 122 and a third electrode 123, the second transistor 130 comprises a fourth electrode 131, a fifth electrode 132 and a sixth electrode 133, the third transistor 140 comprises a seventh electrode 141, an eighth electrode 142 and a ninth electrode 143, and the fourth transistor 150 comprises a tenth electrode 151, an eleventh electrode 152, and a twelfth electrode 153. The first electrode 121 of the first transistor 120 is electrically connected with the second terminal 112 of the first inverter 110, the fourth electrode 131 of the second transistor 130 is electrically connected with the first terminal 111 of the first inverter 110, the seventh electrode 141 of the third transistor 140 is electrically connected with the second terminal 112 of the inverter 110 and the first electrode 121 of the first transistor 120, the tenth electrode 151 of the fourth transistor 150 is electrically connected with the third electrode 123 of the first transistor 120 and the fifth electrode 132 of the second transistor 130, and the eleventh electrode 152 of the fourth transistor 150 is electrically connected with the ninth electrode 143 of the third transistor 140. In this embodiment, the first electrode 121 of the first transistor 120, the fourth electrode 131 of the second transistor 130, the seventh electrode 141 of the third transistor 140 and the tenth electrode 151 of the fourth transistor 150 are gate electrodes. Besides, the threshold voltage detection circuit 100 further comprises a signal receiving terminal 160 electrically connected with the first terminal 111 of the first inverter 110 and the fourth electrode 131 of the second transistor 130, and the signal receiving terminal 160 may receive an input signal.

Figure 1B:
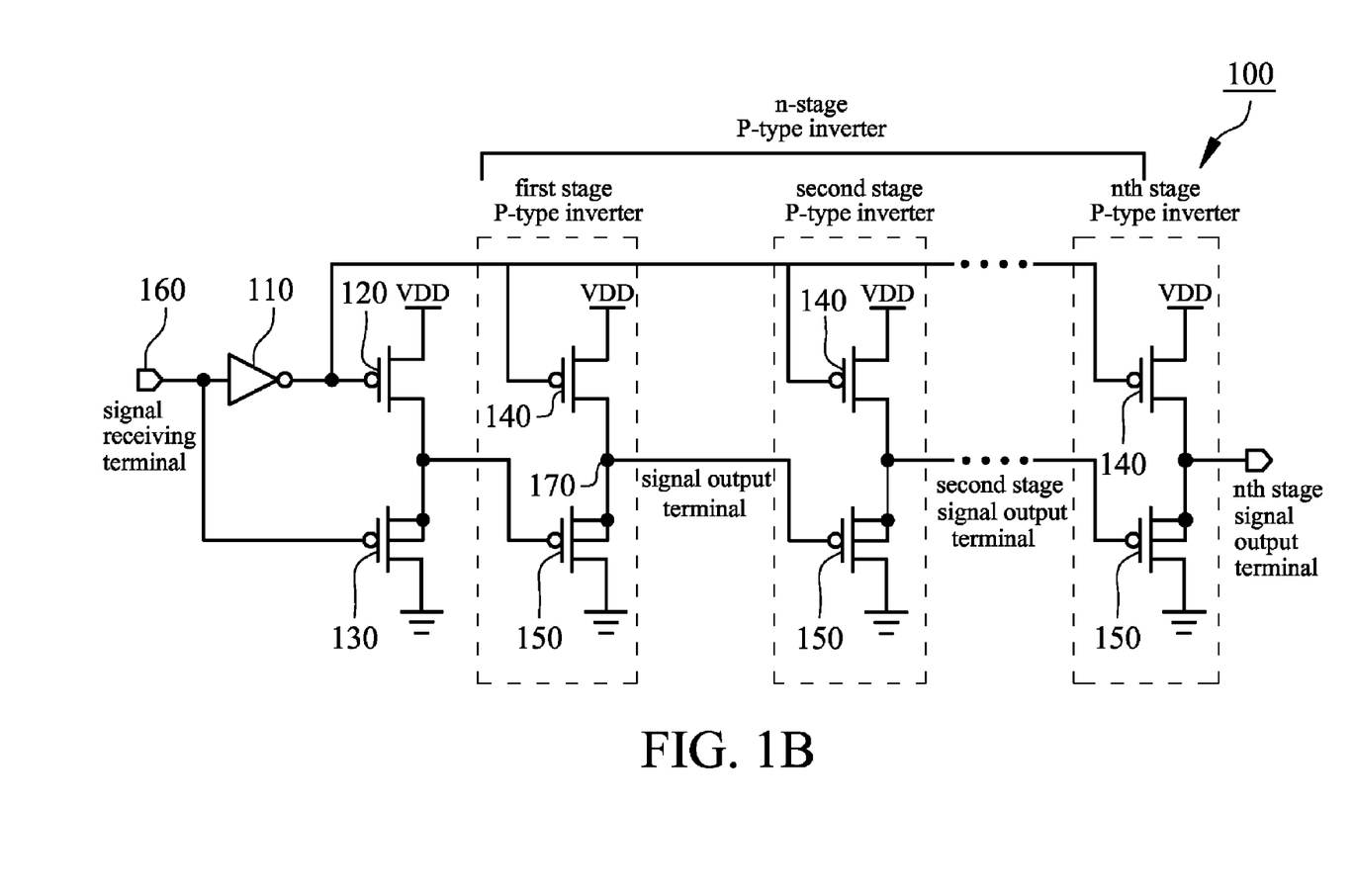
FIG. 1B is a circuit diagram illustrating the threshold voltage detection circuit in accordance with a first preferred embodiment of the present invention.

With reference to FIG. 1A again, FIG. 1A represents a first preferred embodiment. In this embodiment, the first transistor 120, the second transistor 130, the third transistor 140 and the fourth transistor 150 can be PMOS transistors, in addition, the second electrode 122 of the first transistor 120, the fifth electrode 132 of the second transistor 130, the eighth electrode 142 of the third transistor 140 and the eleventh electrode 152 of the fourth transistor 150 are source electrodes, the third electrode 123 of the first transistor 120, the sixth electrode 133 of the second transistor 130, the ninth electrode 143 of the third transistor 140 and the twelfth electrode 153 of the fourth transistor 150 are drain electrodes. The threshold voltage detection circuit 100 further comprises a signal output terminal 170 electrically connected with the drain electrode of the third transistor 140 and the source electrode of the fourth transistor 150. In this case, the signal output terminal 170 may output a voltage $V_p$ which equals to $2 \times V_{thp}$. Furthermore, the second transistor 130 comprises a first body electrode 134, the fourth transistor 150 comprises a second body electrode 154, the first body electrode 134 is electrically connected with the source electrode of the second transistor 130, and the second body electrode 154 is electrically connected with the source electrode of the fourth transistor 150. Mentioned connection relationship may lower the variance of PMOS threshold voltage fluctuated by voltage source drift. Referring to FIG. 1A again, when the threshold voltage detection circuit 100 is activated, the signal receiving terminal 160 receives a 1.2 volt input signal. In the mean time, the signal output terminal 170 and a first node N1 electrically connected between the drain electrode of the first transistor 120 and the source electrode of the second transistor 130 charge up to 1.2 volt. The second transistor 130 would be closed when the source-gate voltage of the second transistor 130 is smaller than the threshold voltage of the second transistor 130. Therefore, once the input signal is switched from 1.2 volt to 0 volt, the voltage of the first node N1 discharges down to $V_{thp}$, and a second node N2 electrically connected between the second terminal 112 of the first inverter 110 and the gate electrode of the first transistor 120 can be 1.2 volt to shut down the first transistor 120 and the third transistor 140. Besides, the fourth transistor 150 would be closed when the source-gate voltage of the fourth transistor 150 is smaller than the threshold voltage of the fourth transistor 150. Consequently, the output signal of the signal output terminal 170 discharges down to $2 \times V_{thp}$ and completes detection. In addition, with reference to FIG. 1B, through expansion of single-stage inverter, the threshold voltage detection circuit 100 can be expanded as a multi-stage detection circuit. In this embodiment, owing to the fact that the threshold voltage detection circuit 100 possesses n stage inverters, the nth signal output terminal may be represented by the following formula: $V_p = (n+1) \times V_{thp}$.

With reference to FIG. 2A, FIG. 2A represents a second preferred embodiment of this invention, the difference between the second embodiment and the first embodiment is that the first transistor 120, the second transistor 130, the third transistor 140 and the fourth transistor 150 are NMOS transistors. Besides, the second electrode 122 of the first transistor 120, the fifth electrode 132 of the second transistor 130, the eighth electrode 142 of the third transistor 140, the eleventh electrode 152 of the fourth transistor 150 are source electrodes, the third electrode 123 of the first transistor 120, the sixth electrode 133 of the second transistor 130, the ninth electrode 143 of the third transistor 140 and the twelfth electrode 153 of the fourth transistor 150 are drain electrodes. In this embodiment, the threshold voltage detection circuit 100 further comprises a second inverter 180, one end of the second inverter 180 is electrically connected with the signal receiving terminal 160, and another end of the second inverter 180 is electrically connected with the first terminal 111 of the first inverter 110 and the gate electrode of the second transistor 130. In this case, the signal output terminal 170 may output a voltage $V_n$ which equals to $V_{DD} - 2 \times V_{thn}$. Referring to FIG. 2A again, when the threshold voltage detection circuit 100 is activated, the signal receiving terminal 160 receives a 1.2 volt input signal. In the mean time, the signal output terminal 170 and a third node N3 electrically connected between the drain electrode of the first transistor 120 and the source electrode of the second transistor 130 discharge down to zero volt. The second transistor 130 would be closed when the gate-source voltage of the second transistor 130 is smaller than the threshold voltage of the second transistor 130. Therefore, once the input signal is switched from 1.2 volt to zero volt, the third node N3 charges up to $V_{DD}-V_t$. In the mean time, a fourth node N4 electrically connected between the second terminal 112 of the first inverter 110 and the gate electrode of the first transistor 120 can be zero volt to shut down the first transistor 120 and the third transistor 140.

Figure 2B:
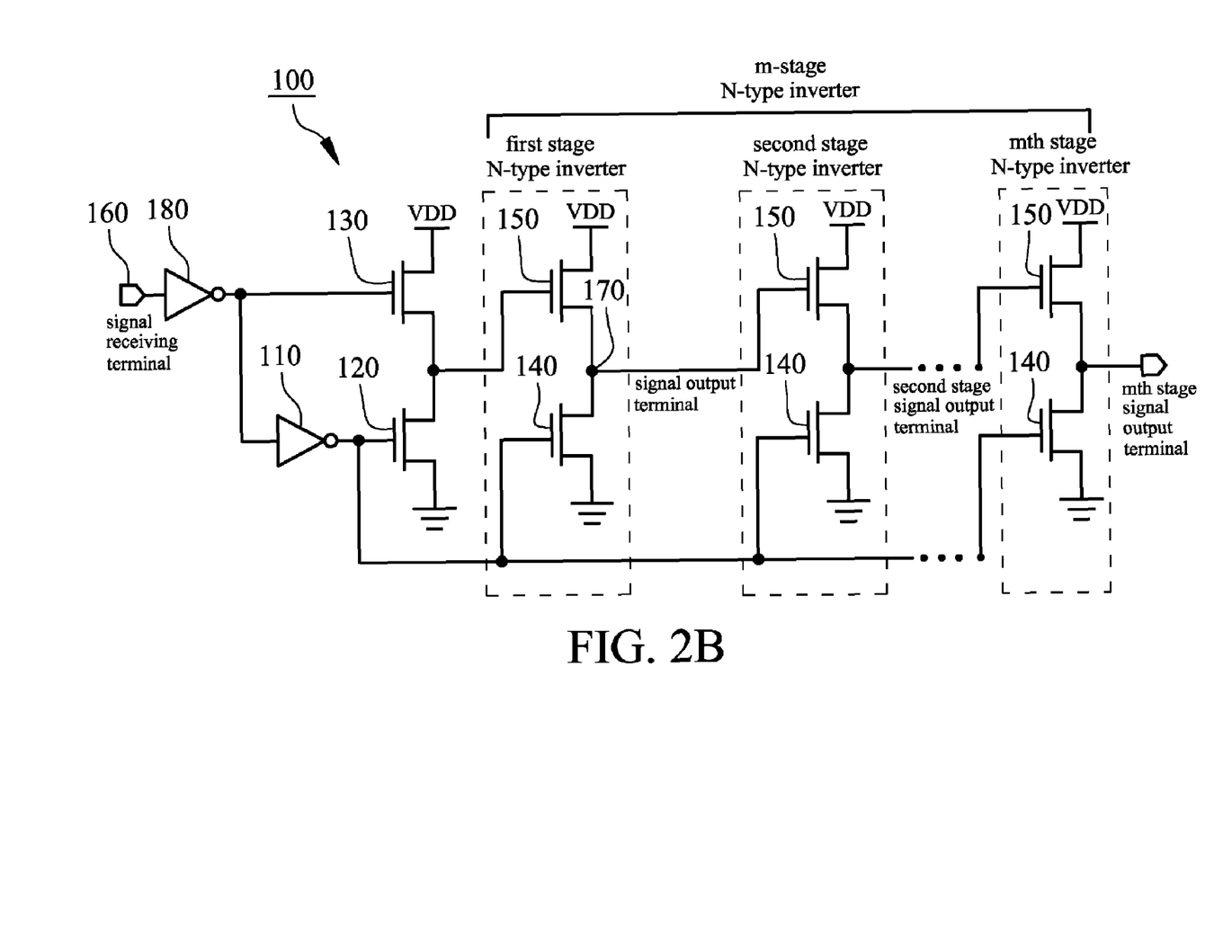
FIG. 2B is a circuit diagram illustrating the threshold voltage detection circuit in accordance with another embodiment of the present invention.
Figure 3:
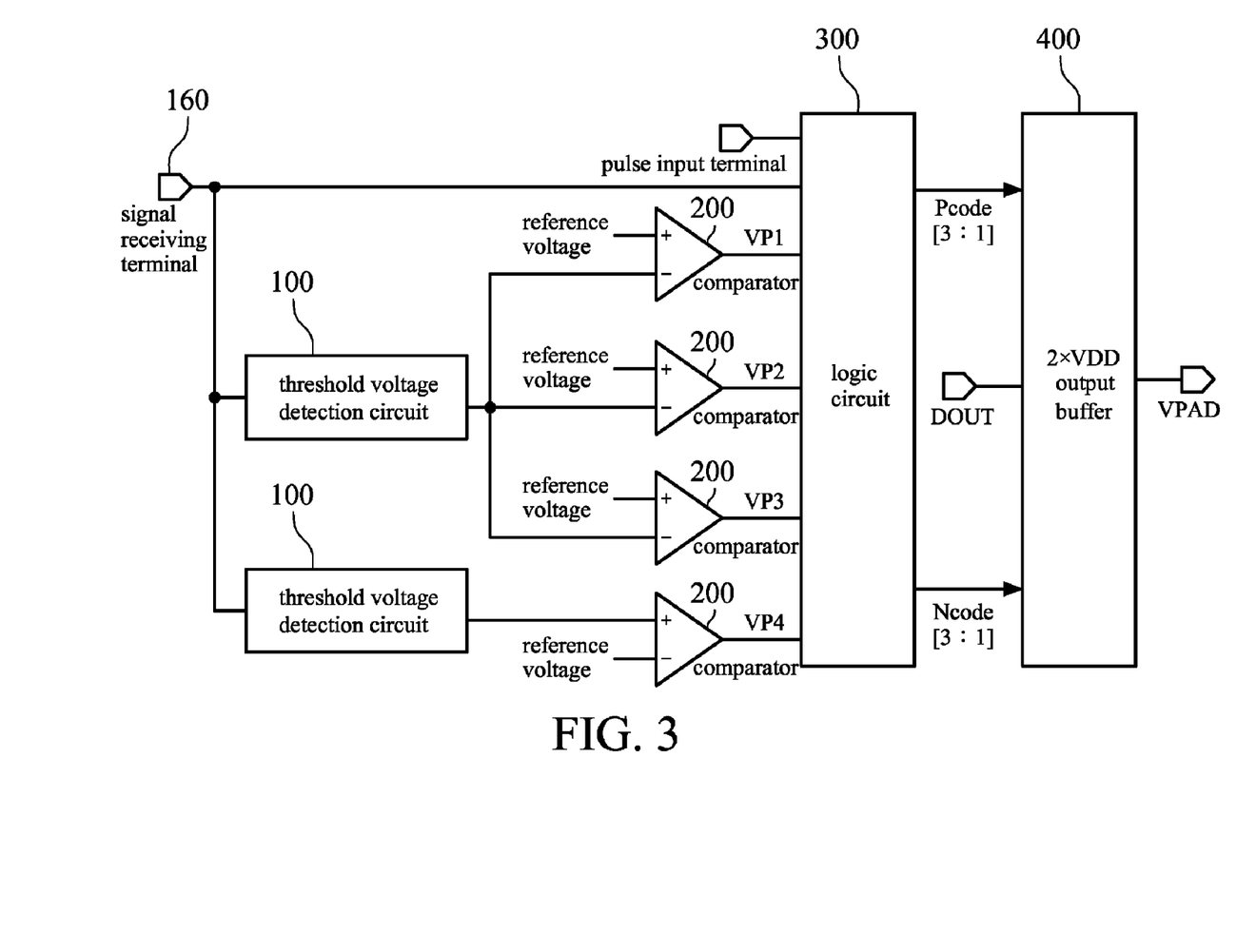
FIG. 3 is a block diagram illustrating the threshold voltage detection circuit applied to a $2 \times V_{DD}$ output buffer.
Figure 4:
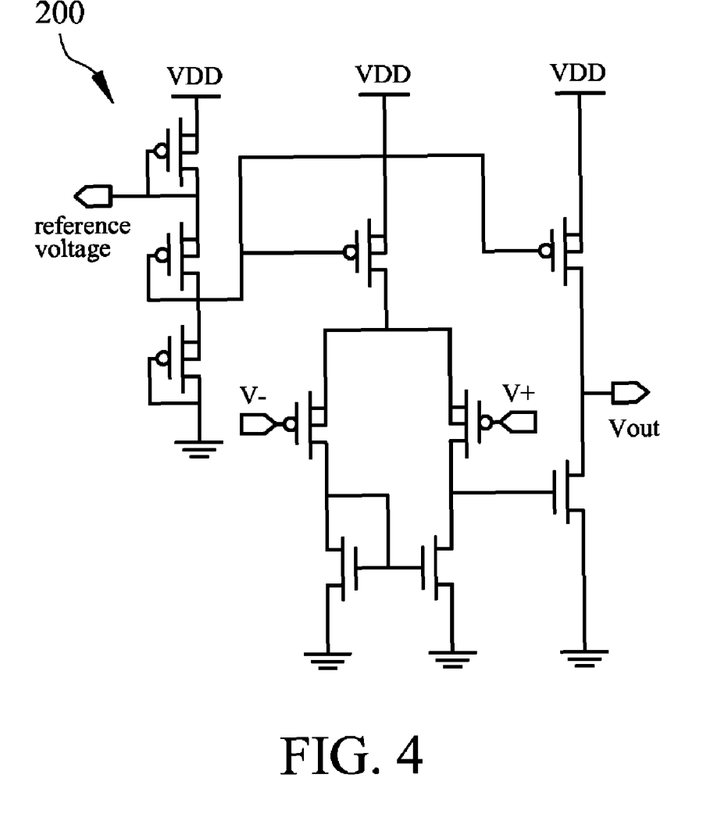
FIG. 4 is a circuit diagram of a comparator.
Figure 5:
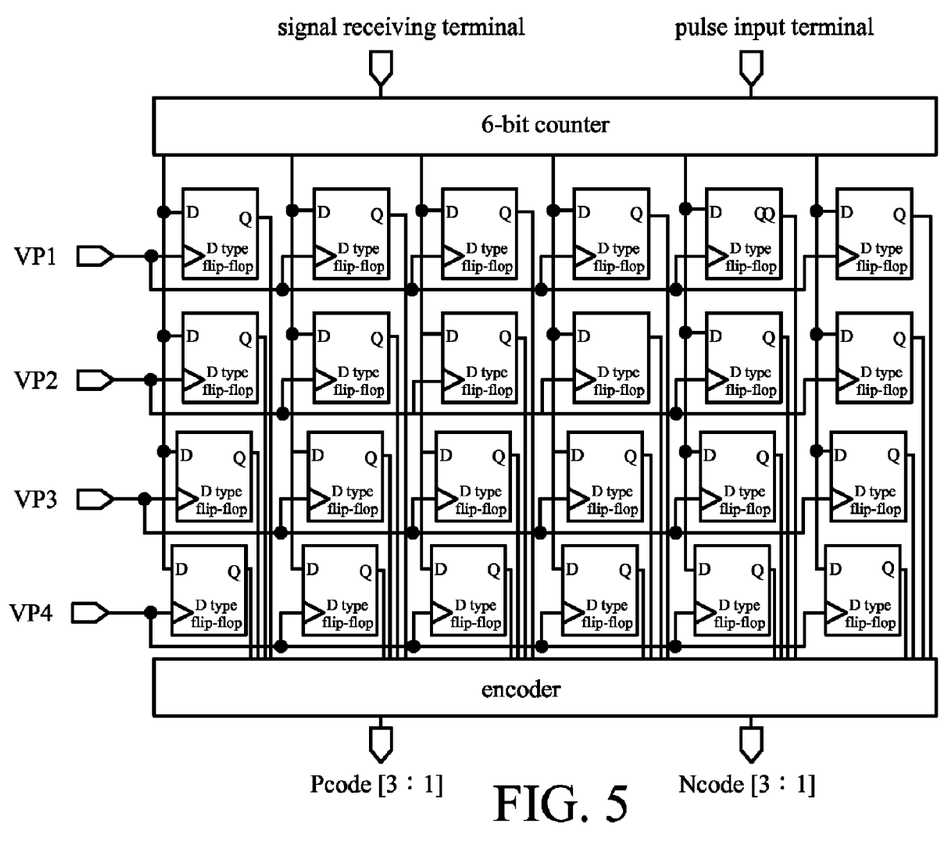
FIG. 5 is a circuit diagram of a digital circuit.
Figure 6:
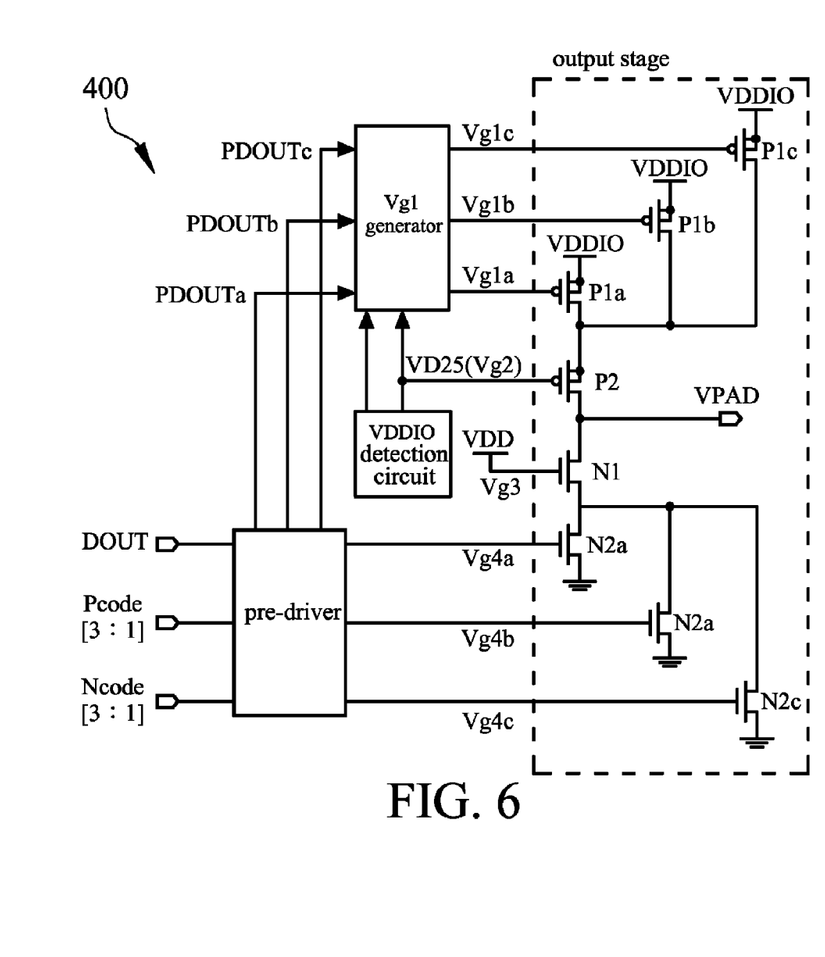
FIG. 6 is a block diagram of the $2 \times V_{DD}$ output buffer.

Besides, the fourth transistor 150 would be closed when the gate-source voltage of the fourth transistor 150 is smaller than the threshold voltage of the fourth transistor 150. Therefore, the output signal of the signal output terminal 170 charges up to $V_{DD}-2\times V_{thn}$ and completes detection. In addition, with reference to FIG. 2B, through expansion of single-stage inverter, the threshold voltage detection circuit 100 can be expanded as a multi-stage detection circuit. In this embodiment, owing to the fact that the threshold voltage detection circuit 100 possesses m stage inverters, the mth signal output terminal may be represented by the following formula: $V_n = V_{DD} - (m+1) \times V_{thn}$.

With reference to FIGS. 3, 4, 5 and 6, the threshold voltage detection circuit 100 is applicable to a $2\times V_{DD}$ output buffer 400. The threshold voltage detection circuit 100 is electrically connected with a plurality of comparators 200, wherein the comparators 200 are electrically connected with a logic circuit 300, and the logic circuit 300 is electrically connected with the $2\times V_{DD}$ output buffer 400. In accordance with the first embodiment, when the output signal of the signal output terminal 170 of the threshold voltage detection circuit 100 discharges down to $2\times V_{thp}$, the counter within the logic circuit 300 takes count of pulse signal in compliance with pulse input terminal. When the output signal of the threshold voltage detection circuit 100 is smaller than reference voltage of the comparator 200, the comparator 200 outputs a high potential signal. Then, a counting result is captured by the logic circuit 300 and enables the logic circuit 300 to encode the counting result into a three-bit digital signal. The digital signal represents the compensation for PMOS transistors. In this invention, the threshold voltage detection circuit 100 may detect the variance of the threshold voltage of MOS transistors. Besides, the action of compensation may lower the variance of various process corners and be capable of determining that a MOS transistor is belonged to a certain process corner.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A threshold voltage detection circuit comprising:
    a first inverter having a first terminal and a second terminal;
    a first transistor having a first electrode, a second electrode and a third electrode, the first electrode is electrically connected with the second terminal of the first inverter;
    a second transistor having a fourth electrode, a fifth electrode and a sixth electrode, the fourth electrode is electrically connected with the first terminal of the first inverter;
    a third transistor having a seventh electrode, an eighth electrode and a ninth electrode, the seventh electrode is electrically connected with the second terminal of the first inverter and the first electrode of the first transistor; and
    a fourth transistor having a tenth electrode, an eleventh electrode and a twelfth electrode, the tenth electrode is electrically connected with the third electrode of the first transistor and the fifth electrode of the second transistor, and the eleventh electrode is electrically connected with the ninth electrode of the third transistor.

2. The threshold voltage detection circuit in accordance with claim 1, wherein the first electrode of the first transistor, the fourth electrode of the second transistor, the seventh electrode of the third transistor and the tenth electrode of the fourth transistor are gate electrodes.

3. The threshold voltage detection circuit in accordance with claim 2, wherein the first transistor, the second transistor, the third transistor and the fourth transistor can be PMOS transistors.

4. The threshold voltage detection circuit in accordance with claim 3, wherein the second electrode of the first transistor, the fifth electrode of the second transistor, the eighth electrode of the third transistor and the eleventh electrode of the fourth transistor are source electrodes, the third electrode of the first transistor, the sixth electrode of the second transistor, the ninth electrode of the third transistor and the twelfth electrode of the fourth transistor are drain electrodes.

5. The threshold voltage detection circuit in accordance with claim 4 further comprises a signal output terminal electrically connected with the drain electrode of the third transistor and the source electrode of the fourth transistor, wherein the signal output terminal is represented by the following formula: $V_p=(n+1)\times V_{thp}$.

6. The threshold voltage detection circuit in accordance with claim 4, wherein the second transistor comprises a first body electrode, the fourth transistor comprises a second body electrode, the first body electrode is electrically connected with the source electrode of the second transistor, and the second body electrode is electrically connected with the source electrode of the fourth transistor.

7. The threshold voltage detection circuit in accordance with claim 2, wherein the first transistor, the second transistor, the third transistor and the fourth transistor are NMOS transistors.

8. The threshold voltage detection circuit in accordance with claim 7, wherein the second electrode of the first transistor, the fifth electrode of the second transistor, the eighth electrode of the third transistor, the eleventh electrode of the fourth transistor are source electrodes, the third electrode of the first transistor, the sixth electrode of the second transistor, the ninth electrode of the third transistor and the twelfth electrode of the fourth transistor are drain electrodes.

9. The threshold voltage detection circuit in accordance with claim 8 further comprises a signal output terminal electrically connected with the drain electrode of the third transistor and the source electrode of the fourth transistor, wherein the signal output terminal is represented by the following formula: $V_n=V_{DD}-(m+1)\times V_{thn}$.

10. The threshold voltage detection circuit in accordance with claim 1 further comprises a signal receiving terminal, wherein the first terminal of the first inverter and the fourth terminal of the second transistor are electrically connected with the signal receiving terminal.

* * * * *